United States Patent
Arnoult

(10) Patent No.: US 12,134,820 B2
(45) Date of Patent: Nov. 5, 2024

(54) PROCESS FOR MAKING A FABRIC BASED SUBSTRATE BEARING A CARBON BASED COATING

(71) Applicant: AGC GLASS EUROPE, Louvain-la-neuve (BE)

(72) Inventor: Grégory Arnoult, Noville-les-Bois (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 0 days.

(21) Appl. No.: 17/761,846

(22) PCT Filed: Sep. 23, 2020

(86) PCT No.: PCT/EP2020/076540
§ 371 (c)(1),
(2) Date: Mar. 18, 2022

(87) PCT Pub. No.: WO2021/058547
PCT Pub. Date: Apr. 1, 2021

(65) Prior Publication Data
US 2022/0275503 A1 Sep. 1, 2022

(30) Foreign Application Priority Data
Sep. 23, 2019 (EP) .................... 19199069

(51) Int. Cl.
| | | |
|---|---|---|
| C23C 16/26 | (2006.01) | |
| C23C 16/04 | (2006.01) | |
| C23C 16/455 | (2006.01) | |
| C23C 16/50 | (2006.01) | |
| C23C 16/52 | (2006.01) | |
| D06M 10/06 | (2006.01) | |
| D06M 11/74 | (2006.01) | |
| D06M 101/32 | (2006.01) | |
| D06M 101/34 | (2006.01) | |

(52) U.S. Cl.
CPC ............ *C23C 16/26* (2013.01); *C23C 16/045* (2013.01); *C23C 16/45517* (2013.01); *C23C 16/50* (2013.01); *C23C 16/52* (2013.01); *D06M 10/06* (2013.01); *D06M 11/74* (2013.01); *D06M 2101/32* (2013.01); *D06M 2101/34* (2013.01)

(58) Field of Classification Search
CPC ......... C23C 16/26; C23C 16/50; C23C 16/52; H05H 1/24
See application file for complete search history.

(56) References Cited

U.S. PATENT DOCUMENTS

| | | | | | |
|---|---|---|---|---|---|
| 4,975,144 | A | * | 12/1990 | Yamazaki | ......... H01L 21/32139 216/48 |
| 5,770,273 | A | * | 6/1998 | Offer | ....................... C23C 4/134 427/446 |
| 5,891,518 | A | * | 4/1999 | Acevedo | ............. C04B 41/5001 427/389.9 |
| 6,091,081 | A | * | 7/2000 | Matsubara | ........ H01L 21/76834 257/77 |
| 6,203,898 | B1 | * | 3/2001 | Kohler | ..................... B05D 1/62 428/688 |
| 7,566,478 | B2 | * | 7/2009 | Ward | .................... C01B 32/162 427/249.1 |
| 9,157,191 | B2 | * | 10/2015 | Selwyn | ............... D06M 15/277 |
| 2004/0147191 | A1 | * | 7/2004 | Wen | ........................ C23C 16/26 442/168 |
| 2008/0170982 | A1 | * | 7/2008 | Zhang | ...................... D02G 3/44 423/447.3 |
| 2009/0280276 | A1 | * | 11/2009 | Noll | ...................... C23C 16/045 428/34.1 |
| 2010/0028238 | A1 | | 2/2010 | Maschwitz | |
| 2010/0080841 | A1 | * | 4/2010 | Porbeni | .................. D06M 10/02 424/618 |
| 2014/0110397 | A1 | * | 4/2014 | He | ........................ H05B 3/34 219/528 |
| 2014/0216343 | A1 | | 8/2014 | Maschwitz | |
| 2014/0220361 | A1 | | 8/2014 | Maschwitz | |
| 2014/0260955 | A1 | * | 9/2014 | Aharonov | ............. C23C 28/343 204/192.15 |
| 2015/0002021 | A1 | | 1/2015 | Maschwitz | |
| 2015/0004330 | A1 | | 1/2015 | Maschwitz | |
| 2015/0076580 | A1 | * | 3/2015 | Pachamuthu | .......... H10B 41/20 257/314 |
| 2016/0064026 | A1 | * | 3/2016 | Arora | ...................... C23C 14/30 204/192.34 |
| 2016/0076580 | A1 | * | 3/2016 | Rode | ....................... F16C 25/06 411/246 |

(Continued)

FOREIGN PATENT DOCUMENTS

| | | | | |
|---|---|---|---|---|
| EP | 1576226 B1 | * | 3/2008 | ............ D06M 11/74 |
| KR | 10-1052729 B1 | | 7/2011 | |
| WO | WO 2005/028741 A1 | * | 3/2005 | ............ D06M 14/18 |

OTHER PUBLICATIONS

Jaroszewski, M., et al., "Dielectric properties of polypropylene fabrics with carbon plasma coatings for applications in the technique of electromagnetic field shielding." Journal of Non-Crystalline Solids 356 (2010) 625-628.*
Jelil, R. Abd, et al., "A review of low-temperature plasma treatment of textile materials". J Mater Sci (2015) 50:5913-5943.*
Kreter, A., et al., "Effect of surface roughness and substrate material on carbon erosion and deposition in the TEXTOR tokamak". Plasma Phys. Control. Fusion 50 (2008) 095008, pp. 1-12.*
Yong, S., et al., "The influence of textile substrate on the performance of multilayer fabric supercapacitors". Journal of Industrial Textiles, 2021, vol. 50(9) 1397-1408.*
Jost, Kristy, et al., "Carbon coated textiles for flexible energy storage". Energy Environ. Sci., 2011, 4, 5060-5067.*
Frenzel, Lisa-Marie, et al., "Coating of solid substrates with carbon via hydrothermal carbonization". Materials Letters, 288 (2021) 129315, pp. 1-4.*

(Continued)

*Primary Examiner* — Bret P Chen
(74) *Attorney, Agent, or Firm* — Oblon, McClelland, Maier & Neustadt, L.L.P.

(57) ABSTRACT

A hollow cathode plasma enhanced chemical vapor deposition process for depositing a hydrophobic carbon based coating on a fabric substrate.

16 Claims, 1 Drawing Sheet

(56) References Cited

U.S. PATENT DOCUMENTS

2017/0142819 A1* 5/2017 Poenitzsch ............... H05H 1/46
2019/0131140 A1* 5/2019 Sun ....................... C09K 13/00

OTHER PUBLICATIONS

International Search Report issued Jan. 19, 2021 in PCT/EP2020/076540 filed Sep. 23, 2020, 6 pages.

Caschera, D., et al., "Ultra Hydrophobic/Superhydrophilic Modified Cotton Textiles through Functionalized Diamond-Like Carbon Coatings for Self-Cleaning Applications", Langmuir, vol. 29, No. 8, XP055677927, 2013, pp. 2775-2783.

Kundu, D., et al., "Plasma enhanced Chemical Vapour deposited amorphous carbon coating for hydrophobicity enhancement in commercial cotton fabrics", Physica E: Low-dimensional Systems and Nanostructures, vol. 114, XP055677920, 2019, pp. 1-10.

Ogwu, A., et al., "The effect of PECVD plasma decomposition on the wettability and dielectric constant changes in silicon modified DLC films for potential MEMS and low stiction applications", Aip Advances, vol. 2, No. 3, XP055678335, 2012, 9 total pages.

* cited by examiner

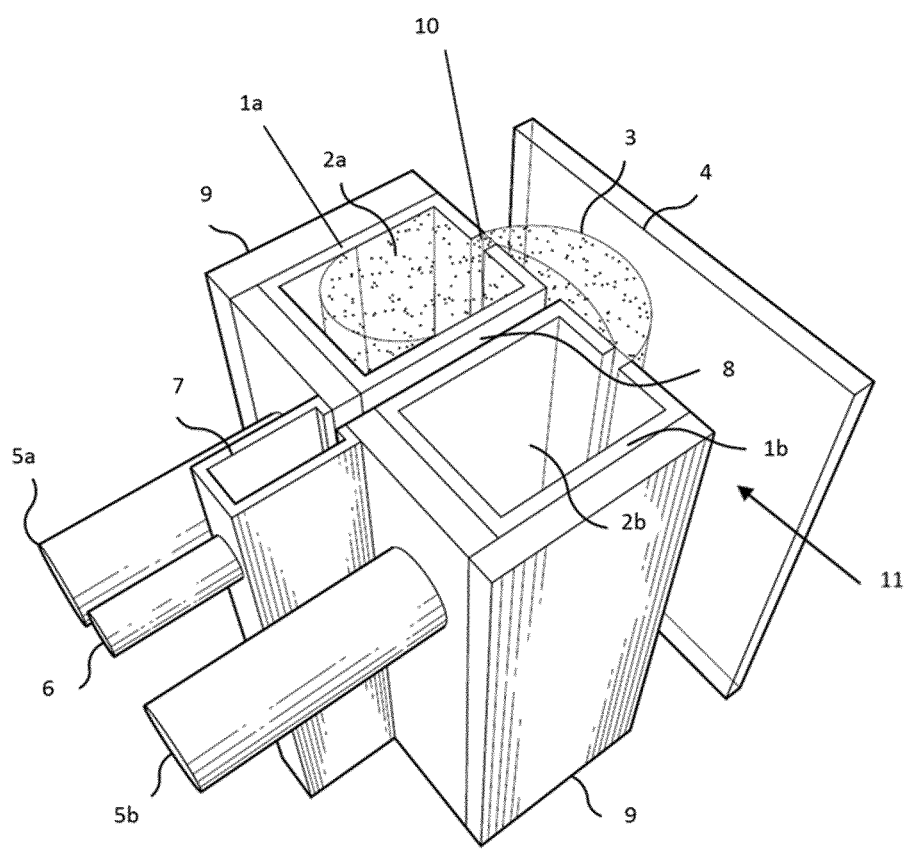

PROCESS FOR MAKING A FABRIC BASED SUBSTRATE BEARING A CARBON BASED COATING

Technical Field

The invention relates to a fabric substrate bearing a carbon based coating and to a hollow cathode plasma enhanced chemical vapor deposition process for depositing a hydrophobic carbon based coating on fabric substrates.

Carbon based hydrophobic coatings may make fabric substrates waterproof, reducing or even eliminating the absorption or wicking of water by the fabric substrates. They may also provide coated fabric substrates with resistance against mechanical wear.

Background Art

Hydrophobic coatings based on fluorinated hydrocarbons are well known for waterproofing fabric substrates, but have been found to problematic from an ecological point of view.

Carbon based coatings have been developed that also provide a certain level of hydrophobicity. To produce carbon based coatings so-called plasma enhanced chemical vapor deposition (PECVD) methods may be used. These methods can be used when coating certain fabric substrates for various coating materials. The coating of fabric substrates presents an additional difficulty of coating throughout the three dimensional structure of the fabric substrate. Frequent issues encountered when coating fabric substrates are the increase of the fabric substrate temperature and the melting or burning of the fabric fibers. This may limit the applicability of certain coating techniques to certain fibers with sufficiently high temperature resistance and/or this may lead to additional cooling being required during coating.

A general issue with coating fabric substrates, in particular substrates based on synthetic, polymeric fibers, is the low adhesion of functional coatings such as hydrophobic coatings for example on these fibers. Pre-treatments or surface activation processes, by wet chemistry or plasma techniques have been described. While in many ways effective, these treatments may structurally weaken the textile fibers or in the case of plasma treatments, lead to the melting or burning of the fibers. Furthermore adhesion of carbon based coatings, in particular when they contain significant amounts of spa hybridized carbon, is particularly challenging.

Summary of Invention

One of the objectives of the present invention is to provide hydrophobic carbon based coatings on fabric substrates by the use of a low-pressure hollow cathode PECVD process, which pressure is for the present application between 0.005 and 0.050 Torr in the process chamber.

An additional objective of the present invention is to provide such a hydrophobic carbon based coating which show high adhesion to fabric substrates and has high mechanical wear resistance.

An additional objective of the present invention is to provide a simple process for depositing hydrophobic carbon based coatings on fabric substrates, in particular showing high adhesion, in particular showing high abrasion wear resistance.

FIG. 1 shows a plasma source, of hollow cathode type for use in the present invention which contains one pair of electrodes.

The invention relates to a process for the production of hydrophobic a carbon based coating on fabric substrates comprising the stages consisting in:

Providing a fabric substrate;

providing a first plasma source, of linear hollow-cathode type, comprising at least one pair of hollow-cathode plasma generating electrodes connected to an AC, DC or pulsed DC generator, for the deposition of said carbon based coating on the fabric substrate;

Injecting a first plasma generating gas in the first plasma source's electrodes at a flow rate of between 1500 and 4500 sccm per linear meter of plasma of the first plasma source;

applying an first electrical power to the first plasma source, so that the first power density of the plasma is between 4 kW and 15 kW per linear meter of plasma of the first plasma source;

injecting a gaseous precursor of carbon at a flow rate of between 100 and 500 sccm per linear meter of plasma of the first plasma source, the gaseous precursor being injected into the plasma in at least between the electrodes of each electrode pair of the first plasma source;

depositing a carbon based coating on the fabric substrate's surface by exposing the fabric substrate to the plasma of the first plasma source.

The inventors have found that, by the use of the process, it is possible to obtain hydrophobic carbon based coatings on fabric substrates. The resulting fabric substrates show high hydrophobicity, i.e. high water contact angles. The first plasma source deposits the hydrophobic carbon based coating on the fabric substrate.

"Plasma source of hollow cathode type," is taken to mean a plasma or ion source comprising one or more electrodes configured to produce hollow cathode discharges. One example of a hollow cathode plasma source is described in U.S. Pat. No. 8,652,586 to Maschwitz, incorporated herein by reference in its entirety. FIG. 1 shows a plasma source of hollow cathode type that may be used in the present invention. The first and second plasma sources each comprises at least one pair of hollow cathode electrodes (1a) and (1b), arranged in parallel and connected via an AC power source (not shown). Electrically insulating material (9) is disposed around the hollow cathode electrodes. The plasma generating gas is supplied via the inlets (5a) and (5b). When used, the precursor gas is supplied via the precursor gas inlet (6) and led through manifold (7) and precursor injection slot (8) in the dark space between the electrodes, into the plasma curtain 3. The AC power source supplies a varying or alternating bipolar voltage to the two electrodes. The AC power supply initially drives the first electrode to a negative voltage, allowing plasma formation, while the second electrode is driven to a positive voltage in order to serve as an anode for the voltage application circuit. This then drives the first electrode to a positive voltage and reverses the roles of cathode and anode. As one of the electrodes is driven negative (1a), a discharge (2a) forms within the corresponding cavity. The other electrode then forms an anode, causing electrons to escape the plasma through the outlet (10) and travel to the anodic side, thereby completing an electric circuit. A plasma having a curtain shape (3) is thus formed in the region between the first and the second electrodes above the substrate (4). Substrate (4) is presently illustrated as a single sheet of fabric, it may however also be in the shape of a long ribbon, for instance in a roll-to-roll type coating device. This method of driving hollow cathodes with AC power contributes formation of a uniform linear plasma that spans across the fabric substrate, perpendicular to the travelling direction (11) of the fabric substrate. For the purpose of the present patent, the electron emitting surfaces may also be called plasma generating surfaces.

"Closed circuit electron drift" is taken to mean an electron current caused by crossed electric and magnetic fields. In many conventional plasma forming devices the closed circuit electron drift forms a closed circulating path or "racetrack" of electron flow.

"AC power" is taken to mean electric power from an alternating source wherein the voltage is changing at some frequency in a manner that is sinusoidal, square wave, pulsed or some other waveform. Voltage variations are often from negative to positive, i.e. with respect to ground. When in bipolar form, power output delivered by two leads is generally about 180° out of phase.

"Electrodes" provide free electrons during the generation of a plasma, for example, while they are connected to a power supply providing a voltage. The electron-emitting surfaces of a hollow cathode are considered, in combination, to be one electrode. Electrodes can be made from materials well-known to those of skill in the art, such as steel, stainless steel, copper, or aluminum. However, these materials must be carefully selected for each plasma-enhanced process, as different gasses may require different electrode materials to ignite and maintain a plasma during operation. It is also possible to improve the performance and/or durability of the electrodes by providing them with a coating.

The invention additionally relates to a process for the production of hydrophobic a carbon based coating on fabric substrates comprising the stages consisting in:

Providing a fabric substrate;

providing a first plasma source, of linear hollow-cathode type, comprising at least one pair of hollow-cathode plasma generating electrodes connected to an AC, DC or pulsed DC generator, for the deposition of said carbon based coating on the fabric substrate;

Injecting a first plasma generating gas in the first plasma source's electrodes at a flow rate of between 1500 and 4500 sccm per linear meter of plasma of the first plasma source;

applying an first electrical power to the first plasma source, so that the first power density of the plasma is between 4 kW and 15 kW per linear meter of plasma of the first plasma source;

injecting a gaseous precursor of carbon at a flow rate of between 100 and 500 sccm per linear meter of plasma of the first plasma source, the gaseous precursor being injected into the plasma at least in between the electrodes of each electrode pair of the first plasma source;

providing a second plasma source, of linear hollow-cathode type, comprising at least one pair of hollow-cathode plasma generating electrodes connected to an AC, DC or pulsed DC generator, for the surface activation of said fabric substrate;

injecting a second plasma generating gas in the second plasma source's electrodes at a flow rate of between 1500 and 4500 sccm per linear meter of plasma of the second plasma source;

supplying a second electrical power to the second plasma source, so that the second power density of the plasma is between 10 kW and 20 kW per linear meter of plasma of the second plasma source, and activating the fabric substrate's surface by exposing the fabric substrate to the plasma of the second plasma source, before depositing the carbon based coating on the fabric substrate's surface by exposing the fabric substrate to the plasma of the second plasma source;

depositing a carbon based coating on the fabric substrate's surface by exposing the fabric substrate to the plasma of the first plasma source.

The inventors found that, by the use of the process, it is possible to obtain hydrophobic carbon based coatings on fabric substrates. The resulting fabric substrates show high hydrophobicity, i.e. high water contact angles. The resulting fabric substrates may in addition show high resistance to abrasion. The second plasma source activates the surface of the fabric substrate and thereafter, the first plasma source deposits the hydrophobic carbon based coating on the fabric substrate.

For any plasma source of the present invention, the power density of the plasma is defined as being the power dissipated in the plasma generated at the electrode(s), with reference to the size of the plasma.

The "linear meter of plasma", also referred to here as "total length of the plasma", is defined as the distance between the ends of the plasma generated by a pair of electrodes, in the direction transversal to the travelling direction of the fabric substrate to be coated. When the plasma source comprises more than one pair of electrodes, the total length of the plasma is defined as the sum of the distances between the ends of the plasmas generated by each pair of electrodes, in the direction transversal to the travelling direction of the fabric substrate to be coated.

In a linear hollow-cathode type plasma source, the "power density of the plasma" can be defined as the total power applied to the source, divided by the total length of the plasma.

In certain embodiments of the present invention, for depositing the carbon based coating, the first plasma generating gas/gaseous carbon precursor molar ratio is advantageously comprised between 5 and 30.

For surface activation, in certain embodiments of the present invention, the textile substrate may be in contact with the plasma during a time advantageously comprised between 4 and 12 s, advantageously comprised between 5 and 10 s, advantageously between 6 and 8 s.

The surface activation and carbon coating deposition of the process of the present invention is preferably performed at a pressure between 0.005 and 0.050 Torr, preferably between 0.010 and 0.040 Torr and more preferably between 0.020 and 0.030 Torr. The second and first plasma sources are preferably connected to an AC or pulsed DC generator, the frequencies of which are usually between 5 and 150 kHz, preferably between 5 and 100 kHz, or to a DC generator.

The PECVD sources of the present invention may be operated in a vacuum chamber. This vacuum chamber may be arranged so that it makes it possible to have, next to one another, different sources having different deposition forms. In certain cases, these sources, which make possible different deposition forms, are flat or rotating cathodes for magnetron sputtering depositions. This vacuum chamber may in particular be combined with means to transport fabrics along these sources in a roll-to-roll manner.

According to certain embodiments of the present invention, the second and/or first linear hollow-cathode plasma source used in the present invention can be composed of a hollow cathode comprising, for example, of one or two or more pairs of electrodes connected to an AC or pulsed DC generator, into which the plasma generating gas is injected, in which discharge takes place, and from whose openings the generated plasma is expelled. Each electrode forms a linear cavity, connected to a pipe which makes it possible to introduce, into the cavity, a plasma generating gas which will be ionized by a discharge. The plasma generated by a linear hollow-cathode plasma source extends lengthwise over the width of the substrate, or essentially in a perpendicular direction to the travelling direction of the substrate.

The electrodes used in the hollow cathode type plasma sources of the present invention may be provided with inlets for supplying the plasma generating gasses and with outlets, for example in the shape of a slit, a row of holes or nozzles, or an array of holes or nozzles, for directing the generated plasma towards the substrate.

According to certain embodiments of the present invention, the distance between the outlets of the electrodes of the plasma sources may be comprised between 5 cm and 15 cm, preferably between 7 cm and 12 cm, preferably between 8 cm and 10 cm. The inventors have found that at shorter distances, the fabric substrates may be damaged, for example through ion bombardment. Larger distance may lead to non-adherent coating, for example graphite coatings, and also to lower hydrophobic effect, and/or less adhesion, and/or less abrasion resistance.

For surface activation, in certain embodiments of the present invention, the second plasma generating gas is generally $O_2$ or an $O_2$/Ar mixture. The frequency of the power generator is usually between 5 and 150 kHz, preferably between 5 and 100 kHz. In certain advantageous embodiments the second plasma generating gas is pure $O_2$.

For the deposition of the carbon based coating, the first plasma generating gas is advantageously Ar or He or an Ar/He mixture. In certain advantageous embodiments the atomic ratio He/ar is comprised between 10 and 0.5, advantageously between 8 and 2, advantageously between 7 and 4, advantageously between 4.5 and 5.5.

The frequency of the power generator is usually between 5 and 150 kHz, preferably between 5 and 100 kHz. The carbon precursor gas is injected uniformly along the first plasma source at least in between the electrodes of each electrode pair.

When the first plasma source comprises more than one pair of electrodes the carbon precursor gas may additionally be injected in between each pair of electrodes towards the plasma that is present in between the outlets of the pair of electrodes of the plasma source, in the space between the substrate and the plasma source. In each case the total flow is evenly distributed between all injection points.

The carbon precursor gas is activated by the first plasma source's plasma. The fabric substrate is taken close to the source and a thin carbon based coating is deposited on the fabric substrate from the activated gas.

The flow rates of the ionizable plasma generating gas introduced into the electrode cavities may be controlled by mass flowmeters which are placed on the pipes between the gas reservoir and the plasma source. The flow rates of precursor gases injected into the plasma may be controlled by mass flowmeters. The working pressure range for the second and first plasma source is usually between 5 and 50 mTorr. Pumping for maintaining the vacuum is preferably provided by turbomolecular pumps, connected to the vacuum chamber. The pumping may be provided on the same side of the fabric substrate, or its travelling path, as the plasma sources and adjacent to the plasma sources. In addition pumping may be provided on the side opposite. In order to obtain good uniformity of the deposition on the fabric substrate, pumping is configured so as to evenly pump over the width of the fabric substrate. The width of the fabric substrate being the direction perpendicular to the travelling direction of the fabric substrate.

In certain embodiments of the present invention, the carbon precursor gas may be a hydrocarbon gas, for example selected among $CH_4$, $C_2H_4$, $C_2H_2$, $C_3H_8$, $C_4H_{10}$. In certain advantageous embodiments the carbon precursor gas is $CH_4$.

In certain advantageous embodiments one or more dopant precursor gases are injected in between the electrodes of each electrode pair of the first plasma source, so as to deposit a doped carbon based coating. The dopant gases may be selected among gases containing W, Ti, Si, O, N, B. In certain advantageous embodiments, the dopant gas contains Si. In certain advantageous embodiments the dopant gas is $SiH_4$, 1,1,3,3-tetramethyl disiloxane (TMDSO), or hexamethyl disiloxane (HMDSO).

A gas used as precursor gas may comprise molecules that at the same provide carbon and a dopant. Hydrogen in the coating may originate from the dopant precursor gas and/or from the carbon precursor gas. Some of the carbon in the coating may originate from the dopant precursor gas.

Any precursor gases may be gaseous at room temperature and pressure, or may be vaporized liquids.

In certain embodiments of the present invention the carbon precursor gas and the dopant precursor gas are the same, providing at the same time the dopant, for example Si, and the carbon. Such a precursor gas may for example be TMDSO or HMDSO.

The flow rate of the gaseous carbon precursor is between 100 and 1000 sccm (standard cubic centimeters per minute) per linear meter of the plasma, preferably between 150 and 500 sccm or between 200 and 400 sccm per linear meter of the plasma. This range is necessary in order to obtain high degrees of deposition appropriate to this technique, of the order of 20 to 100 nm.m/min In certain embodiments of the invention, the ratio of the plasma generating gas flow rate to the gaseous carbon precursor flow rate is at least 5, advantageously between 5 and 30.

According to an embodiment of the present invention the temperature to which the fabric substrate is brought is between 20° C. and 40° C. With the process of the present invention this temperature may maintained in the absence of cooling means.

The fabric substrate may be selected among textiles based on one or more of the following fibrous materials or fibers: synthetic fibers, for example Polyester, Polyethylene, Polypropylene, or Aramid, natural fibers, for example wool, cotton, silk, or linen. The textile substrate may be a woven or a non-woven textile.

Generally, in the present invention, the fabric substrate can include any textile, fabric material, fabric clothing, felt, or other fabric structure. The term "fabric" can be used to mean a textile, a cloth, a fabric material, fabric clothing, or another fabric product. The term "fabric structure" is intended to mean a structure having warp and weft that is woven, non-woven, knitted, tufted, crocheted, knotted, and/or pressured, for example. The terms "warp" and "weft" refer to weaving terms that have their ordinary means in the textile arts, as used herein, e.g., warp refers to lengthwise or longitudinal yarns on a loom, while weft refers to crosswise or transverse yarns on a loom.

Additionally, fabric substrates useful in the present invention can include fabric substrates that have fibers that can be natural and/or synthetic. It is notable that the term "fabric substrate" does not include materials commonly known as any kind of paper (even though paper can include multiple types of natural and synthetic fibers or mixture of both types of fibers). Furthermore, fabric substrates include both textiles in its filament form, in the form of fabric material, or even in the form of fabric that has been crafted into finished article (clothing, blankets, tablecloths, napkins, bedding material, curtains, carpet, shoes, etc.). In some examples, the fabric substrate has a woven, knitted, non-woven, or tufted fabric structure.

In an embodiment of the present invention the fabric substrate can be a woven fabric where warp yarns and weft yarns are mutually positioned at an angle of about 90°. This woven fabric can include, but is not limited to, fabric with a plain weave structure, fabric with a twill weave structure where the twill weave produces diagonal lines on a face of the fabric, or a satin weave. The fabric substrate can be a knitted fabric with a loop structure including one or both of warp-knit fabric and weft-knit fabric. The weft-knit fabric refers to loops of one row of fabric are formed from the same yarn. The warp-knit fabric refers to every loop in the fabric structure that is formed from a separate yarn mainly introduced in a longitudinal fabric direction. The fabric substrate can also be a non-woven product, for example a flexible fabric that includes a plurality of fibers or filaments that are bonded together and/or interlocked together by a chemical treatment process (e.g. a solvent treatment), a mechanical treatment process (e.g. embossing), a thermal treatment process, or a combination of two or more of these processes.

In an embodiment of the present invention the fabric substrate can include one or both of natural fibers and synthetic fibers. Natural fibers that can be used include, but are not limited to, wool, cotton, silk, linen, jute, flax or hemp. Additional fibers that can be used include, but are not limited to, rayon fibers, or those of thermoplastic aliphatic polymeric fibers derived from renewable resources, including, but not limited to, corn starch, tapioca products, or sugarcanes. These additional fibers can be referred to as "natural" fibers. In some examples, the fibers used in the fabric substrate includes a combination of two or more from the above-listed natural fibers, a combination of any of the above-listed natural fibers with another natural fiber or with synthetic fiber, a mixture of two or more from the above-listed natural fibers, or a mixture of any thereof with another natural fiber or with synthetic fiber.

In an embodiment of the present invention the synthetic fibers that can be used in the fabric substrate can include polymeric fibers such as, but not limited to, polyvinyl chloride (PVC) fibers, polyvinyl chloride (PVC)-free fibers made of polyester, polyamide, polyimide, polyacrylic, polyacrylonitrile, polypropylene, polyethylene, polyurethane, polystyrene, polyaram known as Kevlar® for example, (trademark of E. I. du Pont de Nemours and Company), fiberglass, poly(trimethylene terephthalate), polycarbonate, polyester terephthalate, polyethylene or polybutylene terephthalate. In some examples, the fiber used in the fabric substrate can include a combination of two or more fiber materials, a combination of a synthetic fiber with another synthetic fiber or natural fiber, a mixture of two or more synthetic fibers, or a mixture of synthetic fibers with another synthetic or natural fiber. In some examples, the fabric substrate is a synthetic polyester fiber or a fabric made from synthetic polyester fibres.

In an embodiment of the present invention the fabric substrate can include both natural fibers and synthetic fibers. In some examples, the amount of synthetic fibers represents from about 20 wt % to about 90 wt % of the total amount of fibers. In some other examples, the amount of natural fibers represents from about 10 wt % to about 80 wt % of the total amount of fibers. In some other examples, the fabric substrate includes natural fibers and synthetic fibers in a woven structure, the amount of natural fibers is about 10 wt % of a total fiber amount and the amount of synthetic fibers is about 90 wt % of the total fiber amount. In some examples, the fabric substrate can also include additives such as, but not limited to, one or more of colorant (e.g., pigments, dyes, tints), antistatic agents, brightening agents, nucleating agents, antioxidants, UV stabilizers, fillers, lubricants, and combinations thereof.

In an embodiment of the present invention the fabric substrate is selected among textiles based on synthetic fibers.

Very advantageously the fabric substrate is selected among: Polyester based substrates.

The carbon based coatings of the present invention preferably comprise at least 50% (atomic) of carbon. The carbon based coatings of the present invention may optionally comprise up to 50% (atomic) of hydrogen, advantageously up to 30 at % of hydrogen, more advantageously up to 20 at % of hydrogen, even more advantageously up to 10 at % of hydrogen. In particular the carbon content of the carbon based coating may be comprised between 50 at % and 100 at %, in particular between 60 at % and 95 at %, in particular, between 70 at % and 95 at %, in particular between 80 at % and 95 at %.

The carbon based coatings of the present invention optionally comprise one or more dopants selected among W, Ti, Si, O, N, B. Any dopants may be present in the carbon based coating at a dopant/carbon ratio comprised between 1 and 20 at %. When hydrogen is present in the carbon based coating, the dopant content, in atomic percent, may in particular be lower than the hydrogen content, in atomic percent.

Dopants may be introduced with dopant precursor gases such as for example $SiH_4$, TMDSO, HMDSO, $BH_3$. The flow rates of carbon precursor gases and dopant gases are adapted so as to reach the desired composition of the coating, depending of the respective reactivities of the precursor gases.

In certain embodiments of the present invention, the carbon based coating comprises sp2 and sp3 hybridizations in the carbon-carbon bonds. In particular the hybridization ratio sp3/(sp3+sp2) of carbon in the carbon based coating, that the percentage of sp3 hybridized C-C bonds may be comprised between 5 and 80%, in particular between 10 and 70% in particular between 30 and 60%.

In certain advantageous embodiments, the second and/or first plasma sources of hollow cathode type of the present invention has dimensions of between 250 mm and 4000 mm in length and between 100 and 800 mm in width, providing a power of between 5 kW per linear meter of the plasma and 50 kW, advantageously between 5 and 35 kW per meter of plasma of the plasma source.

In each plasma source of the present invention, the power density is applied between any two electrodes of an electrode pair so that the power density is between 5 and 100 kW per meter of plasma, preferably between 5 and 60 kW per meter of plasma. Below this power density of 5 kW per m of plasma, a too high presence of hydrogen residues is observed and, above 100 kW per m of plasma, indeed even sometimes above 60 kW per m of plasma, the formation of powder in the gas phase prejudicial to the quality of the deposition is observed.

The coatings are generally manufactured so that their geometric thickness is between 2 and 1500 nm, preferably between 20 and 800 nm, in particular between 30 and 600 nm. The chosen thickness depends on the technical effect desired for the fabric substrates thus coated. The coating thicknesses are determine by depositing the carbon based coating under the ssame conditions on a flat substrate such as a polymer film, metal sheet or a glass sheet.

The textile substrates may have a thickness comprised between 12 μm and 10 mm, preferably between 15 μm and 5 mm and more preferably between 25 μm and 2 mm.

The present invention further concerns a fabric substrate obtained by any one or more process embodiments described hereinabove.

The present invention thus concerns a fabric substrate comprising a carbon based coating having a carbon to silicon, C/Si, atomic ratio comprised between 0.5 and 7, advantageously between 1 and 7, advantageously between 3 and 6.

The present invention further concerns a vacuum enclosure, such as for example a roll-to-roll vacuum coating enclosure, comprising first and/or second hollow cathode type plasma sources for carrying out the process of the present invention.

The present invention in certain embodiments concerns the following items:

Item 1. Process for the production of carbon based coatings on fabric substrates comprising the stages consisting in:
  Providing a fabric substrate;
  providing a first plasma source, of linear hollow-cathode type, comprising at least one pair of hollow-cathode plasma generating electrodes connected to an AC, DC or pulsed DC generator, for the deposition of said carbon based coating on the fabric substrate;
  Injecting a first plasma generating gas in the first plasma source's electrodes at a flow rate of between 1500 and 4500 sccm per linear meter of the first plasma source;
  applying an first electrical power to the first plasma source, so that the first power density of the plasma is between 4 kW and 15 kW per linear meter of plasma of the first plasma source;
  injecting a gaseous precursor of carbon at a flow rate of between 100 and 500 sccm per linear meter of the first plasma source, the gaseous precursor being injected into the plasma in between the electrodes of each electrode pair of the first plasma source;
  depositing a carbon based coating on the fabric substrate's surface by exposing the fabric substrate to the plasma of the first plasma source.

Item 2. Process for the production of carbon based coatings on fabric substrates according to item 1, further comprising the stages consisting in:
  Providing a second plasma source, of linear hollow-cathode type, comprising at least one pair of hollow-cathode plasma generating electrodes connected to an AC, DC or pulsed DC generator, for the surface activation of said fabric substrate;
  Injecting a second plasma generating gas in the second plasma source's electrodes at a flow rate of between 1500 and 4500 sccm per linear meter of plasma of the second plasma source;
  supplying a second electrical power to the second plasma source, so that the second power density of the plasma is between 10 kW and 20 kW per linear meter of plasma of the second plasma source, and
  activating the fabric substrate's surface by exposing the fabric substrate to the plasma of the second plasma source, before depositing the carbon based coating on the fabric substrate's surface by exposing the fabric substrate to the plasma of the second plasma source.

Item 3. Process for the production of carbon based coatings on fabric substrates according to any one preceding item, characterized in that the carbon precursor gas is selected among $CH_4$, $C_2H_4$, $C_2H_2$, $C_3H_8$, and $C_4H_{10}$.

Item 4. Process for the production of carbon based coatings on fabric substrates according to any one preceding item, characterized in that a dopant precursor gas is injected in between the electrodes of each electrode pair of the first plasma source Item 5. Process for the production of carbon based coatings on fabric substrates according to item 4, characterized in that a dopant precursor gas is selected among gases containing W, Ti, Si, O, N, B.

Item 6. Process for the production of carbon based coatings on fabric substrates according to item 4, characterized in that a dopant precursor gas is selected among $SiH_4$, 1,1,3,3,-Tetramethyldisiloxane (TMDSO), or Hexamethyldisiloxane (HMDSO)

Item 7. Process for the production of carbon based coatings on fabric substrates according to any one preceding item, characterized in that the second plasma generating gas comprises $O_2$ or a mixture of $O_2$ and Ar.

Item 8. Process for the production of carbon based coatings on fabric substrates according to any one preceding item, characterized in that the second plasma generating gas comprises He, Ar or a mixture of He and Ar.

Item 9. Process for the production of carbon based coatings on fabric substrates according to item 8, characterized in that the second plasma generating gas comprises a mixture of He and Ar with an atomic ratio He/Ar comprised between 10 and 0.5, advantageously between 8 and 2, advantageously between 7 and 4, advantageously between 4.5 and 5.5.

Item 10. Process for the production of carbon based coatings on fabric substrates according to any one of items 2 to 9, characterized in that the fabric substrate is exposed to the plasma of the second plasma source during a time advantageously comprised between 4 and 12 s .advantageously comprised between 5 and 10 s, advantageously between 6 and 8 s.

Item 11. Process for the production of carbon based coatings on fabric substrates according to any one preceding item, characterized in that the ratio of the first plasma generating gas flow rate to the gaseous carbon precursor flow rate is at least 5, preferably comprised between 5 and 30, preferably between 6 and 10.

Item 12. Process for the production of carbon based coatings on fabric substrates according to any one preceding item, wherein the temperature of the fabric substrate is at most 40° C.

Item 13. Fabric substrate comprising on at least one of its surfaces a carbon based coating characterized in that the fabric substrate is chosen among a woven fabric and a non-woven fabric, and in that the fabric comprises one or both of natural fibers and synthetic fibers, further characterized in that the carbon based coating comprises between 50 and 100 at % of C, and in that the hybridization ratio sp3/(sp3+sp2) of carbon in the carbon based coating, is comprised between 5 and 80%, preferably between 10 and 70%, more preferably between 30 and 60%.

Item 14. Fabric substrate according to item 13, characterized in that the carbon based coating comprises one or more dopants selected among W, Ti, Si, O, N, and B, and in that the atomic dopant/carbon ratio is comprised between 1 and 20 at %.

Item 15. Fabric substrate according to any one of items 13 to 14, characterized in that the thickness of the carbon based coating is comprised between 2 and 1500 nm, preferably between 20 and 800 nm, more preferably between 30 and 600 nm.

It is to be understood that although preferred embodiments and/or materials have been discussed for providing embodiments according to the present invention, various modifications or changes may be made without departing from the scope and spirit of this invention.

The invention will be more readily understood by reference to the following examples, which are included merely for purpose of illustration of certain aspects and embodiments of the present invention and are not intended to limit the invention.

EXAMPLES

Water Contact angle (WCA) measurements were performed using a Digidrop-DS contact angle measuring device from the GBX company, Beauvais, France. On certain untreated or treated fabrics the water droplet used for water contact angle measurement may also be absorbed by the fabric, indicating very low hydrophobicity.

Abrasion resistance was determined performing WCA measurements after 15000 abrasion cycles using the Martindale abrasion test on the treated textiles. The Martindale abrasion test is described in standard ISO 12947-1998, in our case using the small, (595±7) g, loading piece defined in the standard.

The composition and composition ratio of carbon and silicon was determined by Energy Dispersive X-Ray Analysis with a Scanning Electron Microscope on samples of the identical carbon-based coatings deposited on aluminum substrates.

The hybridization ratio Sp3/(sp2+Sp3) of carbon in the deposited coatings was determined by Raman spectroscopy on samples of the identical carbon-based coatings deposited on glass substrates.

For the examples below plasma sources of hollow cathode type were used that comprise two pairs of electrodes. The plasma sources were incorporated in a vacuum chamber. Flow rates indicated with the units sccm/m are flowrates in sccm per linear meter of plasma. Plasma generating gases are evenly distributed among each electrode. When plasma sources comprise more than one pair of electrodes, the precursor gases are evenly distributed and injected in between the electrodes of each electrode pair and also between the pairs of electrodes.

Scanning Electron Microscope analysis of the substrates shows that the examples according to the invention present no fiber damage, such as melting or etching or burning.

The fabric substrates were 20 x 30 cm$^2$ sheets of fabric transported on a glass carrier by conveyor so as to be brought into contact with the plasma sources.

The pressure in the vacuum chamber was kept at a pressure between 10 and 40 mTorr.

TABLE 1

Fabric Substrates

| Substrate Type | Material | woven or non-woven | thickness | weight/m$^2$ |
| --- | --- | --- | --- | --- |
| 1 | Polyester | non-woven | 1.3 mm | 480 g/m$^2$ |
| 2 | Para-Aramide | woven | 0.2 mm | 135 g/m$^2$ |

In the examples below, surface activation was performed with a second plasma source of linear hollow-cathode type, comprising at two pairs of hollow-cathode plasma generating electrodes connected to an AC, DC or pulsed DC generator, the second plasma generating gas, $O_2$, was injected into the second plasma source's electrodes at a total flow rate of 2000 sccm per linear meter of plasma of the second plasma source, the second power density was 6.5 kW per linear meter of plasma. The fabric substrate was moved through the plasma at a speed of about 6 m/min as many times as necessary to reach the indicated treatment time.

In the examples below, deposition of the carbon based coatings was performed using first plasma source of linear hollow-cathode type, comprising two pairs of hollow-cathode plasma generating electrodes connected to an AC, DC, or pulsed DC generator. The first plasma generating gas, a mixture of He and Ar in an atomic ratio of He/Ar 5:1, at a total flow rate of 2400 sccm per linear meter of plasma of the first plasma source. The carbon precursor, $CH_4$ and the dopant precursor, $SiH_4$, were injected in between the electrodes of each electrode pair of the first plasma source, so as to deposit a carbon based coating on the activated fabric substrate surface. The fabric substrate was moved through the plasma at a speed of about 0.75 m/min as many times as necessary to reach the indicated coating thickness. The thicknesses indicated in the table below are the thicknesses obtained under identical conditions on a glass substrate, as it is not possible to measure coating thicknesses reliably on most fabric substrates.

TABLE 2 example parameters and coating composition

| | | | Carbon based coating | | | | |
| --- | --- | --- | --- | --- | --- | --- | --- |
| Ex. | Substrate Type | Activation time (s) | Carbon precursor | Carbon precursor flow rate (sccm/m) | Dopant precursor | Dopant precursor flow rate (sccm/m) | Thickness (nm) |
| 1 | A | — | $CH_4$ | 300 | $SiH_4$ | 15 | 400 |
| 2 | A | 6 | $CH_4$ | 300 | — | 0 | 400 |
| 3 | A | 6 | $CH_4$ | 300 | $SiH_4$ | 15 | 400 |
| 4 | A | 6 | $CH_4$ | 300 | $SiH_4$ | 45 | 400 |
| 5 | A | 6 | $CH_4$ | 300 | $SiH_4$ | 15 | 100 |
| 6 | A | 6 | $CH_4$ | 100 | $SiH_4$ | 15 | 400 |
| 7 | A | 10 | $CH_4$ | 300 | $SiH_4$ | 15 | 400 |
| 8 | B | — | $CH_4$ | 300 | $SiH_4$ | 15 | 400 |
| 9 | B | 6 | $CH_4$ | 300 | — | 0 | 400 |
| 10 | B | 6 | $CH_4$ | 300 | $SiH_4$ | 15 | 400 |
| 11 | B | 6 | $CH_4$ | 300 | $SiH_4$ | 45 | 400 |

TABLE 2-continued example parameters and coating composition

| | | | Carbon based coating | | | | |
|---|---|---|---|---|---|---|---|
| Ex. | Substrate Type | Activation time (s) | Carbon precursor | Carbon precursor flow rate (sccm/m) | Dopant precursor | Dopant precursor flow rate (sccm/m) | Thickness (nm) |
| 12 | B | 6 | $CH_4$ | 300 | $SiH_4$ | 15 | 100 |
| 13 | B | 6 | $CH_4$ | 100 | $SiH_4$ | 15 | 400 |
| 14 | B | 10 | $CH_4$ | 300 | $SiH_4$ | 15 | 400 |

TABLE 3 coating characteristics and performance measurements

| | Performance | | Carbon based coating composition | | |
|---|---|---|---|---|---|
| Ex | WCA after coating (°) | WCA after abrasion (°) | Thickness (nm) | C/Si | sp3/(sp2 + sp3) |
| 1 | 107 | 96 | 400 | 5 | 0.37 |
| 2 | 114 | 90 | 400 | — | 0.37 |
| 3 | 118 | 107 | 400 | 5 | 0.36 |
| 4 | 115 | 95 | 400 | 1 | 0.37 |
| 5 | 114 | 93 | 100 | 5 | 0.36 |
| 6 | 117 | 84 | 400 | 1.6 | 0.75 |
| 7 | 113 | 88 | 400 | 5 | 0.36 |
| 8 | 122 | Absorption | 400 | 5 | 0.37 |
| 9 | 126 | Absorption | 400 | — | 0.37 |
| 10 | 135 | 115 | 400 | 5 | 0.36 |
| 11 | 129 | Absorption | 400 | 1 | 0.37 |
| 12 | Absorption | Absorption | 100 | 5 | 0.36 |
| 13 | 119 | Absorption | 400 | 1.6 | 0.75 |
| 14 | 122 | Absorption | 400 | 5 | 0.36 |

As can be seen from the tables above, when comparing examples 1 and 8 with examples 3 and 10 respectively, the water contact angles (WCA) after coating are lower and the WCA after abrasion are lower, that is the resistance to abrasion of the coating is less when no activation step is performed.

Longer activation times, such as in examples 7 and 14, compared to examples 3 and 10 respectively, lead to lower WCA after coating but to lower resistance to abrasion.

Lower coating thicknesses lead to lower WCA after abrasion and in particular for substrate B to no hydrophobic affect at all after coating. The reasons for this difference in behavior of the two substrates is not yet completely understood. There may for example be differences in surface area for both substrate types and also differences in inherent differences in hydrophobicity related to the substrate material itself.

When the ratio of carbon precursor flow rate to dopant precursor flow rate was reduced, as in examples 4, 6, 11, and 13 the WCA after coating was still acceptable, while the WCA after abrasion was significantly reduced. As can be seen from the table the C/Si atomic ratio in the coating is reduced when the $CH_4/SiH_4$ precursor flow rate ratio is reduced. However the C/Si atomic ratio is less reduced when the total precursor flow rate of carbon precursor and dopant precursor is lower. Interestingly the hybridization ratio of carbon in the coating is significantly higher in these examples 6 and 13.

The invention claimed is:

1. A process for the production of carbon based coatings on fabric substrates comprising:
    providing a fabric substrate;
    providing a first linear hollow-cathode plasma source comprising at least one pair of hollow-cathode plasma generating electrodes connected to an AC, DC or pulsed DC generator, for the deposition of the carbon based coating on the fabric substrate;
    injecting a first plasma generating gas in the first plasma source's electrodes at a flow rate of between 1500 and 4500 sccm per linear meter of plasma of the first plasma source;
    applying a first electrical power to the first plasma source, so that a first power density of the plasma is between 4 kW and 15 KW per linear meter of the plasma of the first plasma source;
    injecting a carbon precursor gas at a flow rate of between 100 and 500 sccm per linear meter of the plasma of the first plasma source, the carbon precursor gas being injected into the plasma at least between the electrodes of each electrode pair of the first plasma source;
    depositing the carbon based coating directly on the fabric substrate's surface by exposing the fabric substrate to the plasma of the first plasma source,
    providing a second linear hollow-cathode plasma source comprising at least one pair of hollow-cathode plasma generating electrodes connected to an AC, DC or pulsed DC generator, for surface activation of the fabric substrate;
    injecting a second plasma generating gas in the second plasma source's electrodes at a flow rate of between 1500 and 4500 sccm per linear meter of the second plasma source;
    supplying a second electrical power to the second plasma source, so that a second power density of plasma of the second plasma source is between 10 kW and 20 kW per linear meter of the plasma of the second plasma source; and;
    activating the fabric substrate's surface by exposing the fabric substrate to the plasma of the second plasma source, before depositing the carbon based coating on the fabric substrate's surface by exposing the fabric substrate to the plasma of the second plasma source.

2. The process for the production of carbon based coatings on fabric substrates according to claim 1, wherein the carbon precursor gas is selected from a group consisting of $CH_4$, $C_2H_4$, $C_2H_2$, $C_3H_8$, and $C_4H_{10}$.

3. The process for the production of carbon based coatings on fabric substrates according to claim 1, wherein a dopant precursor gas is injected in between the electrodes of each electrode pair of the first plasma source.

4. The process for the production of carbon based coatings on fabric substrates according to claim 3, wherein the dopant precursor gas is selected from a group consisting of W, Ti, Si, O, N, and B.

5. The process for the production of carbon based coatings on fabric substrates according to claim 3, wherein the dopant precursor gas is selected from a group consisting of SiH4, 1,1,3,3,-Tetramethyldisiloxane (TMDSO), and Hexamethyldisiloxane (HMDSO).

6. The process for the production of carbon based coatings on fabric substrates according to claim 1, wherein the second plasma generating gas comprises $O_2$ or a mixture of $O_2$ and Ar.

7. The process for the production of carbon based coatings on fabric substrates according to claim 1, wherein the second plasma generating gas is selected from a group consisting of He, Ar, and a mixture of He and Ar.

8. The process for the production of carbon based coatings on fabric substrates according to claim 7, wherein the second plasma generating gas comprises a mixture of He and Ar with an atomic ratio He/Ar comprised between 10 and 0.5.

9. The process for the production of carbon based coatings on fabric substrates according to claim 8, wherein the second plasma generating gas comprises the mixture of He and Ar with the atomic ratio He/Ar comprised between 8 and 2.

10. The process for the production of carbon based coatings on fabric substrates according to claim 8, wherein the second plasma generating gas comprises the mixture of He and Ar with the atomic ratio He/Ar comprised between 7 and 4.

11. The process for the production of carbon based coatings on fabric substrates according to claim 8, wherein the second plasma generating gas comprises the mixture of He and Ar with the atomic ratio He/Ar comprised between 4.5 and 5.5.

12. The process for the production of carbon based coatings on fabric substrates according to claim 1, wherein the fabric substrate is exposed to the plasma of the second plasma source during a time comprised between 4 and 12.

13. The process for the production of carbon based coatings on fabric substrates according to claim 1, wherein a ratio of the first plasma generating gas flow rate to the carbon precursor gas flow rate is between 5 and 30.

14. The process for the production of carbon based coatings on fabric substrates according to claim 13, wherein the ratio of the first plasma generating gas flow rate to the gaseous carbon precursor gas flow rate is between 6 and 10.

15. The process for the production of carbon based coatings on fabric substrates according to claim 1, wherein a temperature of the fabric substrate is at most 40° C.

16. The process for the production of carbon based coatings on fabric substrates according to claim 1, wherein the fabric substrate is exposed to the plasma of the second plasma source during a time comprised between 5 and 10 s.

\* \* \* \* \*